US008453656B2

(12) United States Patent
Tousimis (10) Patent No.: US 8,453,656 B2
(45) Date of Patent: Jun. 4, 2013

(54) INTEGRATED PROCESSING AND CRITICAL POINT DRYING SYSTEMS FOR SEMICONDUCTOR AND MEMS DEVICES

(76) Inventor: Anastasios J. Tousimis, North Bethesda, MD (US)

( * ) Notice: Subject to any disclaimer, the term of this patent is extended or adjusted under 35 U.S.C. 154(b) by 0 days.

(21) Appl. No.: 13/695,784

(22) PCT Filed: Jun. 25, 2010

(86) PCT No.: PCT/US2010/039980
§ 371 (c)(1),
(2), (4) Date: Nov. 1, 2012

(87) PCT Pub. No.: WO2011/162770
PCT Pub. Date: Dec. 29, 2011

(65) Prior Publication Data
US 2013/0056036 A1 Mar. 7, 2013

(51) Int. Cl.
*B08B 3/00* (2006.01)
(52) U.S. Cl.
USPC ........... 134/95.1; 134/60; 134/94.1; 134/105; 134/114
(58) Field of Classification Search
None
See application file for complete search history.

(56) References Cited

U.S. PATENT DOCUMENTS

| | | | |
|---|---|---|---|
| 4,104,808 A | 8/1978 | Horne et al. | |
| 5,145,508 A * | 9/1992 | Fujiura et al. | 65/388 |
| 5,301,701 A | 4/1994 | Nafziger | |
| 5,647,228 A | 7/1997 | Sager et al. | |
| 5,681,780 A | 10/1997 | Mihara et al. | |
| 5,950,104 A | 9/1999 | Linliu | |
| 6,027,967 A | 2/2000 | Parekh et al. | |
| 6,100,577 A | 8/2000 | Linliu | |
| 6,159,860 A | 12/2000 | Yang et al. | |
| 6,287,960 B1 | 9/2001 | Lao | |
| 6,291,356 B1 | 9/2001 | Ionov et al. | |
| 6,303,434 B1 | 10/2001 | Parekh et al. | |
| 6,309,979 B1 | 10/2001 | Patrick et al. | |
| 6,329,285 B1 | 12/2001 | Nagaoka | |
| 6,350,322 B1 | 2/2002 | Yates | |
| 6,420,098 B1 | 7/2002 | Mautz | |
| 6,493,964 B1 | 12/2002 | Tousimis et al. | |
| 6,528,385 B2 | 3/2003 | Jung et al. | |
| 6,601,595 B2 | 8/2003 | Yates | |
| 6,607,001 B1 | 8/2003 | Yates | |
| 6,620,681 B1 | 9/2003 | Kim et al. | |
| 6,638,833 B1 | 10/2003 | Vassalli et al. | |
| 6,641,677 B1 | 11/2003 | Yates | |
| 6,645,311 B2 | 11/2003 | Yates | |
| 6,656,289 B2 | 12/2003 | Yates | |
| 6,660,642 B2 | 12/2003 | Zheng et al. | |
| 6,686,292 B1 | 2/2004 | Yang et al. | |
| 6,723,654 B2 | 4/2004 | Chang et al. | |

(Continued)

*Primary Examiner* — Eric Golightly
(74) *Attorney, Agent, or Firm* — Miles & Stockbridge P.C.; Frederick F. Rosenberger (57) ABSTRACT

Processing and drying of a sample, such as a semiconductor or MEMS device, is achieved using a single pressure chamber. The pressure chamber holds the sample in a sealed interior volume throughout various process steps, such as, but not limited to, photoresist removal, sacrificial layer etching, flushing or rinsing, dehydration, and critical point drying. The pressure chamber is constructed of a chemically-resistant and pressure-resistant material to withstand the various chemicals and pressures that are encountered in the various process and drying steps. For example, the pressure chamber is constructed from a nickel-copper alloy. Automated release etching and critical point drying of a MEMS or semiconductor device is provided without removing the device from the sealed pressure chamber.

6 Claims, 10 Drawing Sheets

U.S. PATENT DOCUMENTS

| | | | |
|---|---|---|---|
| 6,726,848 | B2 | 4/2004 | Hansen et al. |
| 6,784,105 | B1 | 8/2004 | Yang et al. |
| 6,837,944 | B2 | 1/2005 | Kashkoush et al. |
| 6,857,200 | B1 | 2/2005 | Tousimis et al. |
| 6,891,627 | B1 | 5/2005 | Levy et al. |
| 6,896,740 | B2 | 5/2005 | Yates |
| 6,905,555 | B2 | 6/2005 | DeYoung et al. |
| 7,051,454 | B2 | 5/2006 | Oh |
| 7,052,623 | B1 | 5/2006 | Becker et al. |
| 7,064,071 | B2 | 6/2006 | Schwan |
| 7,129,178 | B1 | 10/2006 | Schwarz et al. |
| 7,163,019 | B2 | 1/2007 | Yates |
| 7,204,889 | B2 | 4/2007 | Yates |
| 7,365,016 | B2 | 4/2008 | Ouellet et al. |
| 7,396,480 | B2 | 7/2008 | Kao et al. |
| 7,422,639 | B2 | 9/2008 | Yates |
| 7,432,177 | B2 | 10/2008 | Papanu et al. |
| 7,435,684 | B1 | 10/2008 | Lang et al. |
| 7,520,957 | B2 | 4/2009 | Kao et al. |
| 7,695,632 | B2 | 4/2010 | Lee et al. |
| 7,767,024 | B2 | 8/2010 | Kao et al. |
| 2002/0197876 | A1 | 12/2002 | Liu |
| 2003/0032292 | A1 | 2/2003 | Noguchi |
| 2003/0077843 | A1 | 4/2003 | Yamauchi et al. |
| 2003/0092261 | A1* | 5/2003 | Kondo et al. ............. 438/638 |
| 2003/0192574 | A1 | 10/2003 | Yates |
| 2004/0091820 | A1 | 5/2004 | Nagai et al. |
| 2004/0198051 | A1 | 10/2004 | Hansen et al. |
| 2005/0221552 | A1 | 10/2005 | Kao et al. |
| 2005/0230350 | A1 | 10/2005 | Kao et al. |
| 2006/0011215 | A1 | 1/2006 | Yates |
| 2006/0051966 | A1 | 3/2006 | Or et al. |
| 2007/0119544 | A1 | 5/2007 | Hansen et al. |
| 2007/0181056 | A1* | 8/2007 | D'Evelyn et al. ............ 117/11 |
| 2007/0272657 | A1 | 11/2007 | Hansen et al. |
| 2008/0000495 | A1 | 1/2008 | Hansen et al. |
| 2008/0305639 | A1 | 12/2008 | Kuo |
| 2009/0029560 | A1 | 1/2009 | Hansen et al. |
| 2009/0032062 | A1 | 2/2009 | Randhawa et al. |
| 2009/0032070 | A1 | 2/2009 | Randhawa et al. |
| 2009/0095334 | A1 | 4/2009 | Huston |
| 2009/0095621 | A1 | 4/2009 | Kao et al. |
| 2009/0111280 | A1 | 4/2009 | Kao et al. |
| 2010/0148317 | A1 | 6/2010 | Lee et al. |

* cited by examiner

| Valve \ Mode | 1st Fluid Valve | 2nd Fluid Valve | 3rd Fluid Valve | Trans. Fluid Valve | Main Line Valve | Bleed Valve | Purge Valve |
|---|---|---|---|---|---|---|---|
| Release Etch | Open | Closed | Closed | Closed | Open | Closed | Closed |
| Chamber Purge (Flush) | Closed | Open | Closed | Closed | Open | Closed | Open |
| Flush Fluid Fill | Closed | Open | Closed | Closed | Open | Closed | Closed |
| Chamber Purge (Dehydrate) | Closed | Closed | Open | Closed | Open | Closed | Open |
| Dehydrating Fluid Fill | Closed | Closed | Open | Closed | Open | Closed | Closed |
| Chamber Cool | Closed | Closed | Closed | Closed | Closed | Closed | Closed |
| Chamber Purge (trans. fluid) | Closed | Closed | Closed | Open | Open | Closed | Open |
| Trans. Fluid Fill | Closed | Closed | Closed | Open | Open | Closed | Closed |
| Heat | Closed | Closed | Closed | Closed | Closed | Closed | Closed |
| Bleed | Closed | Closed | Closed | Closed | Closed | Open | Closed |
| Vent | Closed | Closed | Closed | Closed | Closed | Closed | Open |

INTEGRATED PROCESSING AND CRITICAL POINT DRYING SYSTEMS FOR SEMICONDUCTOR AND MEMS DEVICES

CROSS-REFERENCE TO RELATED APPLICATION

The present application is a U.S. national stage of International Application No. PCT/US10/39980, filed Jun. 25, 2010, which is hereby incorporated by reference herein in its entirety.

FIELD

The present disclosure relates generally to systems for integrated processing and drying of samples, and, more particularly to systems for integrated processing and critical point drying of semiconductor and/or microelectromechanical system (MEMS) devices in a single chamber.

SUMMARY

Processing and drying of a sample, such as a semiconductor or MEMS device, is achieved using a single pressure chamber. The pressure chamber can hold the sample in a sealed interior volume throughout various process steps, such as, but not limited to, photoresist removal, sacrificial layer etching, flushing or rinsing, dehydration, and critical point drying. The pressure chamber can be constructed of a chemically-resistant and pressure-resistant material to withstand the various chemicals and pressures that are encountered in the various processing and drying steps. For example, the pressure chamber may be constructed from Monel, which is a nickel-copper alloy resistant to many of the chemicals commonly employed in MEMS and semiconductor manufacturing. Fluid conveyances connected to the pressure chamber may also be constructed from the chemically-resistant material.

In embodiments, an apparatus for processing of a sample can include a pressure chamber with an interior volume constructed to receive the sample therein. The pressure chamber can have at least one inlet in fluid communication with the interior volume. The apparatus can also include a fluid control module. The fluid control module can be coupled to the at least one inlet and can be configured to control delivery of fluid to the at least one inlet. The apparatus can further include at least one fluid source and a source of transitional fluid coupled to the fluid control module.

In embodiments, an apparatus for processing of a MEMS or semiconductor device can include a pressure chamber having interior surfaces constructed from a nickel-copper alloy. The pressure chamber can have at least one fluid inlet with conduits in fluid communication with the at least one fluid inlet. At least one of the conduits can be configured to be coupled to a source of first fluid. At least another of the conduits can be configured to be coupled to a source of transitional fluid.

In embodiments, an apparatus for processing of a sample can include a pressure chamber, a fluid supply module, and a control system. The fluid supply module can deliver transitional fluid and one or more other fluids to the pressure chamber. The control system can be configured to select and control the delivery of fluid from the fluid supply module to the pressure chamber. The control system may also be configured to heat the pressure chamber with transitional fluid therein to a temperature and pressure above the critical point temperature and pressure of the transitional fluid.

In embodiments, a method for processing a sample can include flowing a first fluid into a sealed pressure chamber so as to contact the sample contained within the sealed pressure chamber. The method may further include flowing a transitional fluid into the sealed pressure chamber at a first temperature and a first pressure such that the transitional fluid in a liquid state contacts the sample. The method may also include heating the transitional fluid in the sealed pressure chamber to a second temperature and a second pressure. The second temperature and second pressure can be greater than a critical point temperature and pressure of the transitional fluid such that the transitional fluid in the sealed pressure chamber is in a supercritical fluid state.

Objects and advantages of the present disclosure will become apparent from the following detailed description when considered in conjunction with the accompanying drawings.

BRIEF DESCRIPTION OF DRAWINGS

Embodiments will hereinafter be described in detail below with reference to the accompanying drawings, wherein like reference numerals represent like elements. The accompanying drawings have not necessarily been drawn to scale. Where applicable, some features may not be illustrated to assist in the description of underlying features.

DETAILED DESCRIPTION

According to the disclosed embodiments, processing and drying of a sample, such as a semiconductor or MEMS device, can be achieved in a single system, in particular a single chamber. The system can include a pressure chamber that holds the sample throughout the various processing steps, such as, but not limited to, photoresist development, structural layer etching, photoresist removal, sacrificial layer etching (i.e., releasing), rinsing or flushing, and dehydration, as well as the drying steps necessary to prepare a semiconductor or MEMS device for use. In order to withstand the kinds of chemicals employed in the processing steps, the pressure chamber and one or more fluid conveyances in the system can be formed from a chemically-resistant material. For example, the chamber and any tubing or piping leading to/from the chamber may be constructed from a metal alloy, such as a Monel alloy. The chamber may also be constructed so as to handle pressure and temperature extremes that may arise during the drying steps.

Appropriate fluid connections allow the introduction of one or more processing agents, which may be in liquid or gaseous form, into the chamber to interact with the sample contained therein. For example, the chamber and associated fluid conduits may be configured to perform a sacrificial layer etch followed by critical point drying (also known as supercritical drying) of a MEMS device. The fluid conduits thus allow a release agent to be introduced into the chamber, which contains an unreleased MEMS device therein. The release agent etches and removes the sacrificial layer or layers of the MEMS device. After removal of the sacrificial layer(s), certain structures on the MEMS device are free to move with respect to others structures on the device.

Without removing the now released MEMS device from the chamber, the release agent in the chamber is replaced with one or more fluid washes of a flushing fluid, such as de-ionized water (DIW), followed by one or more fluid washes of a dehydrating fluid, such as an alcohol. After the final alcohol wash, the MEMS device undergoes a critical point drying process in the chamber using a transitional fluid, such as carbon dioxide. After the completion of the drying process, the released MEMS device can be removed from the chamber for use or further processing.

Figure 1A:
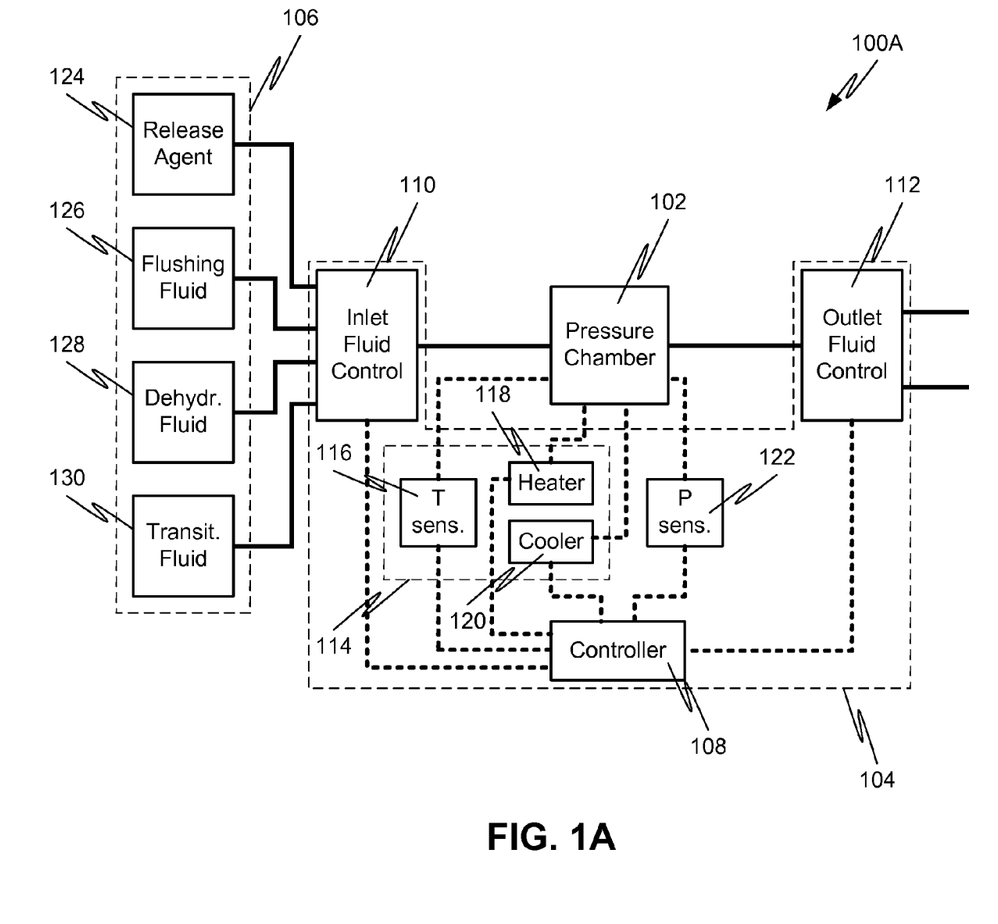
FIG. 1A is a schematic diagram showing components of an integrated processing and drying system, according to one or more embodiments of the disclosed subject matter.

Referring to FIG. 1A, a schematic diagram of an integrated release and critical point drying system 100A is shown. The system 100A includes a pressure chamber 102 that houses the MEMS or semiconductor device through the release and drying steps. A fluid supply 106 can include a variety of fluids for the release, flush, dehydration, and drying stages. The fluid supply 106 can include a release agent supply 124, a flushing fluid supply 126, a dehydrating fluid supply 128, and a transitional fluid supply 130. For example, the release agent supply 124 can be a tank of 49% hydrofluoric (HF) acid or buffered oxide etchant (BOE). The flushing fluid supply 126 can be a tank of de-ionized (DI) water. The dehydrating fluid supply 128 can be a tank of ethanol. The transitional fluid supply 130 can be a pressurized tank of liquid carbon dioxide.

The fluid supply 106 may additionally include one or more fluid sources (not shown) for pre- or post-processing of the MEMS or semiconductor device. For example, a protective layer of photoresist or other material is sometimes provided on a surface of the MEMS device to protect structures thereon during shipment and pre-release handling of the device. In order to perform the sacrificial layer etch, the protective layer is first removed. Fluid supply 106 may include a dissolving agent, such as acetone, for removing the protective layer before beginning the other processing steps.

Gravity may provide the necessary force to convey the chemicals from each fluid supply 124-130 to the pressure chamber 102. Alternatively, the fluids in one or more of the fluid supplies 124-130 can be pressurized. For example, flushing fluid supply 126 may be a DI water source that filters tap water and supplies DIW at a particular water pressure. In another example, the transitional fluid supply 130 may be a pressurized tank of carbon dioxide. The tank may hold the carbon dioxide in liquid form at a pressure of, for example, 100 psi.

Depending on the particular stage in the release and drying process, the fluid source 106 may supply the appropriate fluid to the pressure chamber 102 through inlet fluid control module 110. Inlet fluid control module 110 can include, for example, manual or computer controlled valves, check valves, pipes, tubing, pumps, flow control devices, sensors, or the like. Outlet fluid control module 112 can control the fluid flow from the pressure chamber 102, depending on the particular stage in the release and drying process. Similar to the inlet fluid control module 110, outlet fluid control module 112 can include, for example, manual or computer controlled valves, check valves, pipes, tubing, pumps, flow control devices, sensors, or the like.

Inlet fluid control module 110 and outlet fluid control module 112 may form part of a control system 104, which controls operation of system 100A during the various processing and drying steps. Control system 104 can also include a controller 108, a thermal management module 114, and a pressure sensor 122. Controller 108 is operatively coupled to the various components of the control system 104 for automatic control of the operation of system 100A in executing the various processing and drying steps on the sample contained in chamber 102.

Thermal management module 114 includes a temperature sensor 116 which monitors a temperature of the interior volume of the pressure chamber. Monitoring of the temperature of the pressure chamber 102 may be especially important during the critical point drying process. Cooler 120 is thermally coupled to the pressure chamber 102. For example, cooler 120 may be a thermoelectric cooler, refrigeration loop, or other cooling devices, as known in the art. Controller 108 controls cooler 120 in response to temperature readings from temperature sensor 116 to cool the interior volume of the pressure chamber to a temperature at which transitional fluid introduced into the pressure chamber is in a liquid state. When the transitional fluid is carbon dioxide, this temperature may be, for example, less than 10° C.

Heater 118 is also thermally coupled to the pressure chamber 118. For example, heater 118 may be a thermoelectric heater, resistive heater, or other heating devices, as known in the art. Controller 108 controls heater 118 in response to temperature readings from temperature sensor 118 and to heat the interior volume of the pressure chamber to a temperature and pressure greater than the critical point temperature and pressure of the transitional fluid. Controller 108 may optionally also monitor pressure readings from pressure sensor 122 during the heating process. Above the critical point temperature and pressure, the transitional fluid contained in the pressure chamber transitions to a supercritical fluid state. When the transitional fluid is carbon dioxide, the critical point temperature and pressure is 31° C. and 1072 psi, respectively.

Although the discussion above focuses on a release and drying system for MEMS or semiconductor devices, the teachings herein have application to a wide variety of samples and processes. Additional fluid supplies may be added to fluid supply 106 to enable a variety of processing techniques to be performed on a sample without moving the sample from the pressure chamber. Alternatively, the system 100A may be constructed such that the sample can be disposed in the pressure chamber for a first series of process steps, removed from the chamber for a second series of process steps, and then returned to the chamber for a final series of process steps and/or drying steps.

Figure 1B:
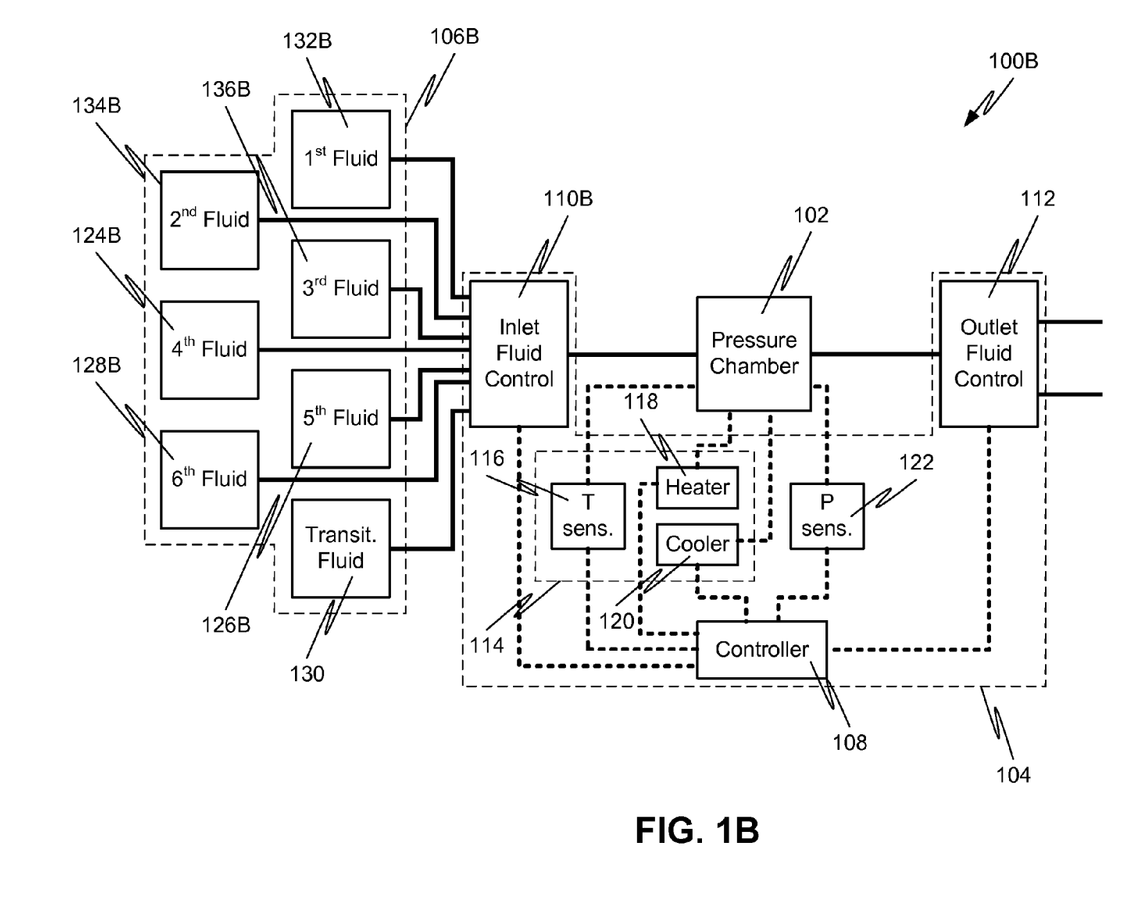
FIG. 1B is a schematic diagram showing components of another integrated processing and drying system, according to one or more embodiments of the disclosed subject matter.

Referring to FIG. 1B, a system 100B is shown which includes additional fluid supplies for performing different process steps as compared with system 100A of FIG. 1A. Fluid supply 106B thus includes a first fluid supply 132B, a second fluid supply 134B, a third fluid supply 136B, a fourth fluid supply 124B, a fifth fluid supply 126B, a sixth fluid supply 128B, and a transitional fluid supply 130. Each of the fluid supplies in fluid supply 106B is coupled to the inlet fluid control module 110B for controlling fluid flow to the pressure chamber 102. The additional fluid supplies 132B, 134B, and 136B, as compared with system 100A of FIG. 1A, allow for additional processing steps to be performed prior to release and critical point drying steps. The number of fluid sources shown in FIG. 1B is for illustrative purposes only. Additional or fewer fluid sources in fluid supply 106B or separate from fluid supply 106B are also possible according to one or more contemplated embodiments.

For example, the sample introduced into the pressure chamber 102 may be a semiconductor device that has undergone a photolithographic process. The device may have exposed but not yet developed patterns in a photoresist layer on a surface of the device. The first fluid supply 132B may thus be a photoresist developer. The pattern in the photoresist may be developed (i.e., portions of the photoresist removed) by introducing the photoresist developer into the sealed pressure chamber with the semiconductor device therein. The second fluid supply 134B may be a structural layer etchant, such as potassium hydroxide (KOH). Once the pattern is formed in the photoresist layer, fluid from the second fluid supply 134B may be introduced into the pressure chamber to etch a portion of the semiconductor device using the patterned photoresist layer as a mask. The third fluid supply 136B may be a substance for removal of photoresist, such as acetone. The third fluid can be introduced after the etching of the semiconductor device and flushing of the pressure chamber is complete. Between each of the above processing steps, the chamber 102 may be flushed with a rinsing agent, such as DIW contained in fifth fluid supply 126B. Similar to the configuration of system 100A, fourth fluid supply 124B (e.g., sacrificial layer etchant), fifth fluid supply 126B (e.g., flushing fluid), and sixth fluid supply 128B (e.g., dehydrating fluid) can be introduced sequentially into the pressure chamber to release structures of the semiconductor device and prepare it for critical point drying.

Of course, the fluids in the various fluid supplies of fluid supply 106B are not limited to those disclosed above, nor are the potential processes limited to etching or developing. Rather, the construction and configuration of the pressure chamber and associated fluid conveyances and controls allow the integration of various manufacturing process steps, including critical point drying, into a single setup. The pressure chamber may thus include various components, such as agitators or stirring rods, which may be applicable to one or more of the processes. Whereas prior techniques required separate stations or devices for processing of a sample, the integrated processing and drying systems of the present disclosure thus a sample to undergo multiple processes and drying in a single station without removal of the sample from the pressure chamber.

Figure 2:
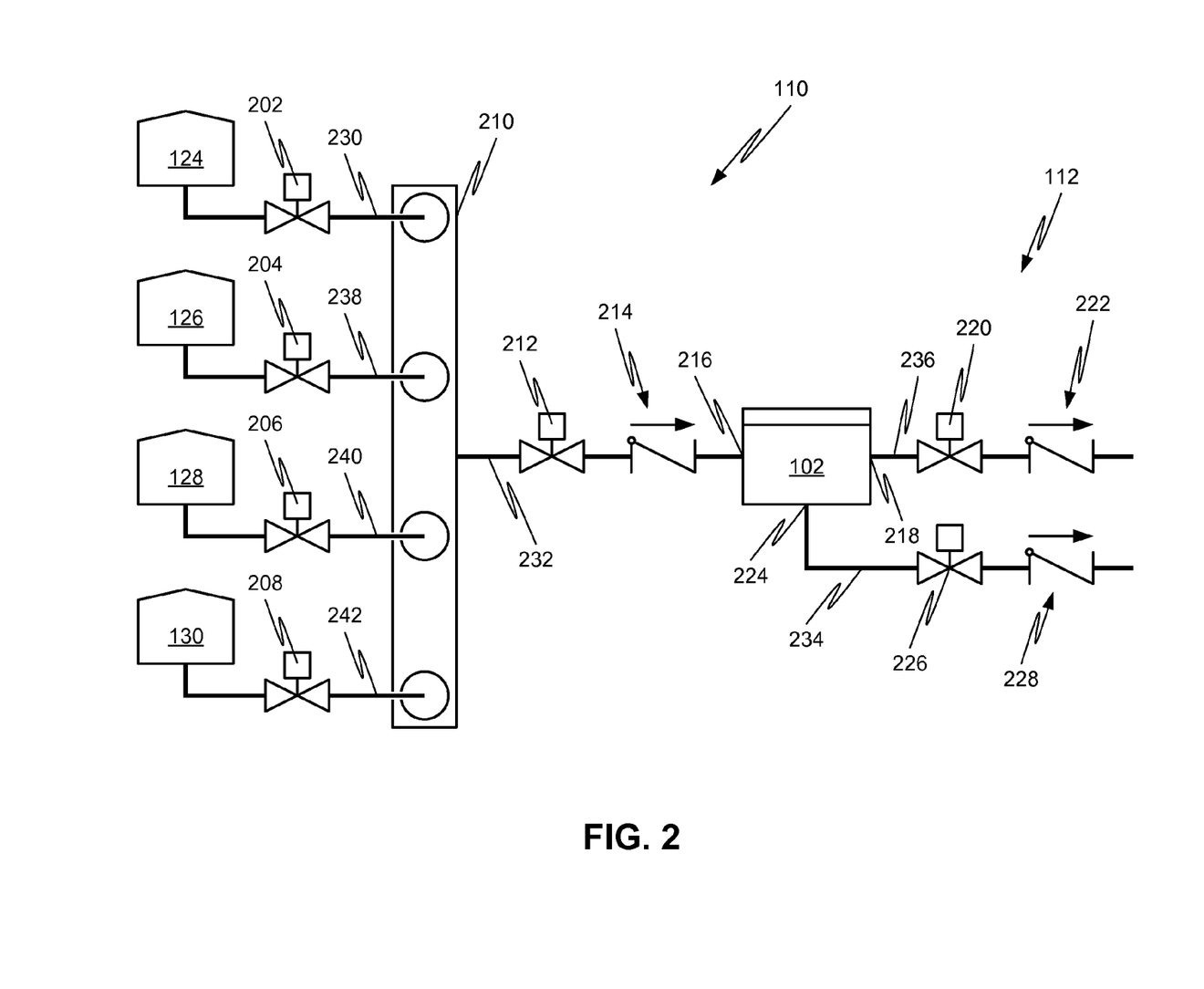
FIG. 2 is a schematic diagram showing a configuration of fluid control components in an integrated processing and drying system, according to one or more embodiments of the disclosed subject matter.

Referring now to FIG. 2, a setup for the inlet fluid control module 110 and the outlet fluid control module 112 within system 100 is shown. Inlet fluid control module 110 can include components of the primary inlet line 232 as well as components for conveying fluid from the fluid sources 124-130 to the inlet line 232. The primary inlet line 232 is connected to an inlet 216 of pressure chamber 102. Primary inlet line 232 can be constructed from one or more pipe or tube segments and can include one or more fluid control components within the flow path. For example, a controllable main line valve 212 is provided in flow path 232 to control the flow of fluid flowing therethrough and into pressure chamber 102 through inlet 216. A check valve 214 may also be provided in flow path 232 to prevent backflow in the primary inlet line 232, i.e., flow of fluid from pressure chamber 102 back into primary inlet line 232.

A fluid input column 210 can connect each of the fluid supplies 124-130 to the primary inlet line 232 through individual input lines. For example, release agent supply 124 can be connected to the fluid input column 210 by a first input line 230. First input line 230 can also include a controllable release agent valve 202 to control the flow of release agent from the supply 124 to the fluid input column 210 and thereby to primary inlet line 232. Flushing fluid supply 126 can be connected to the fluid input column 210 by a second input line 238. Second input line 238 can include a controllable flushing fluid valve 204 to control the flow of flushing fluid from the supply 126 to the fluid input column 210 and thereby to the primary inlet line 232. Dehydrating fluid supply 128 can be connected to the fluid input column 210 by a third input line 240. Third input line 240 can include a controllable dehydrating fluid valve 204 to control the flow of dehydrating fluid from the supply 128 to the fluid input column 210 and thereby to the primary inlet line 232. Transitional fluid supply 130 can be connected to the fluid input column 210 by a fourth input line 242. Fourth input line 242 can include a controllable transitional fluid valve 208 to control the flow of transitional fluid from the supply 130 to the fluid input column 210 and thereby to the primary inlet line 232.

The outlet fluid control module 112 can include components of a main vent line 234 and a secondary bleed line 236. The main vent line 234 is connected to a primary outlet 224 of pressure chamber 102. Main vent line 234 can be constructed from one or more pipe or tube segments and can include one or more fluid control components within the flow path. For example, a controllable purge valve 226 is provided in flow path 234 to control the flow of fluid from the outlet 224 of the pressure chamber 102. A check valve 228 may also be provided in flow path 234 to prevent any backflow of exhausted fluid into the pressure chamber 102.

Secondary bleed line 236 is connected to a secondary outlet 218 of pressure chamber 102. Secondary bleed line can be constructed from one or more pipe or tube segments and can include one or more fluid control components within the flow path. For example, a controllable bleed valve 220 is provided in flow path 236 to control the flow of fluid from secondary outlet 218 of the pressure chamber 102. A check valve 222 may also be provided in flow path 236 to prevent any backflow of exhausted fluid into the pressure chamber 102.

Note that the output of the main vent line 234 may be discarded as waste or recycled for re-use in the integrated system 100 or other systems, as appropriate. Likewise the output of the secondary bleed line 236 may be discarded as waste or recycled for re-use. Alternatively, when the output of the secondary bleed line 236 is a naturally occurring gas (e.g., carbon dioxide), the output may be exhausted to the atmosphere.

Various other fluid flow control configurations besides those illustrated in FIG. 2 are also possible. For example, the relative position of controllable valves and check valves in a particular flow path may be reversed. It is further emphasized that the figures herein have not been drawn to scale, nor does the relative position of components illustrated in the figures necessarily represent actual or intended positions of the components in practical embodiments. For example, although valve 226 has been illustrated in FIG. 2 as being positioned at a particular distance from pressure chamber 102, in an actual device the distance between outlet 224 and valve 226 may be minimized or omitted. Accordingly, embodiments of the disclosed subject matter are not intended to be limited to the particular spatial arrangements and configurations illustrated in the figures.

Because of the caustic chemicals employed in various processing steps, the chamber 102, as well as fluid flow components in the inlet and outlet fluid control modules 110 and 112, can be made from a material that can withstand exposure to these chemicals as well as the temperature and pressure extremes of the drying process. For example, the chamber 102, inlet fluid control module 110, and outlet fluid control module 112 can be made from a Monel alloy. Monel is a nickel-copper alloy containing about 60% nickel, about 38% copper, and small amounts of iron, manganese, carbon, silicon, or other elements. For example, Monel Alloy 400 can include at least 63% nickel, at most 2.5% iron, at most 2% manganese, at most 0.5% silicon, between 28% and 34% copper, at most 0.3% carbon, and at most 0.024% sulfur. Monel Alloy K-500 can include 66.5% nickel, 2.0% iron, 1.5% manganese, 0.5% silicon, 2.7% aluminum, 0.5% titanium, 30% copper, and 0.01% sulfur.

Various other types of metals and/or metal alloys may also be employed for the pressure chamber and fluid control modules depending on the type of chemicals in the processing and drying steps and the chemical resistance of the metal or alloy thereto. Such metals and metals alloys may include, but are not limited to, nickel, nickel alloys, nickel-iron-chromium alloys, nickel-chromium alloys, nickel-copper alloys, and stainless steel. When the processing steps employ a release agent such as hydrofluoric acid, the pressure chamber and fluid control modules are preferably constructed from a nickel-copper alloy such as a Monel alloy, which demonstrates sufficient chemical resistance to hydrofluoric acid.

As the use of Monel alloy is designed to protect components from caustic chemicals and withstand pressures of the drying process, Monel alloy may be used for any of the fluid conveyance components that will be exposed to both the caustic chemicals of the processing steps and elevated pressures of the drying steps. Those components that are exposed to caustic chemicals but not drying step pressures may be constructed from a Monel alloy or another chemically resistant material, such as polytetrafluoroethylene (PTFE). Those components of the integrated system that are not exposed to any caustic chemicals but are exposed to drying step pressures may be constructed from a Monel alloy or other material sufficiently strong to withstand said pressures, such as steel. Those components of the integrated system that are not exposed to any caustic chemicals or drying step pressures may be constructed from a Monel alloy or any other material capable of containing the conveyed fluid.

Referring again to FIG. 2, release agent supply 124 would normally contain the caustic chemicals while the remaining fluid supplies 126-130 would normally be considered noncaustic. Thus, valve 202 and release agent input line 230 may be constructed from a Monel alloy or a chemically resistant polymer. Valves 204-208 and input lines 238-242 may be constructed from Monel alloy, steel or other metal, or a polymer. Fluid input column 210 would also be exposed to caustic chemicals during the release process, but would not normally be exposed to release process pressures due to check valve 214. Thus, fluid input column 210 may be constructed from a Monel alloy or a chemically resistant polymer. Valve 212, check valve 214, components of input line 232, and pressure chamber 102 would be exposed to caustic chemicals during the release process and may be exposed to drying process pressures as well. The same would be true of the components of output fluid control module 112. Accordingly, valve 212, check valve 214, input line 232, pressure chamber 102, and the components of output fluid control module 112 may all be constructed from Monel alloy.

Figure 3:
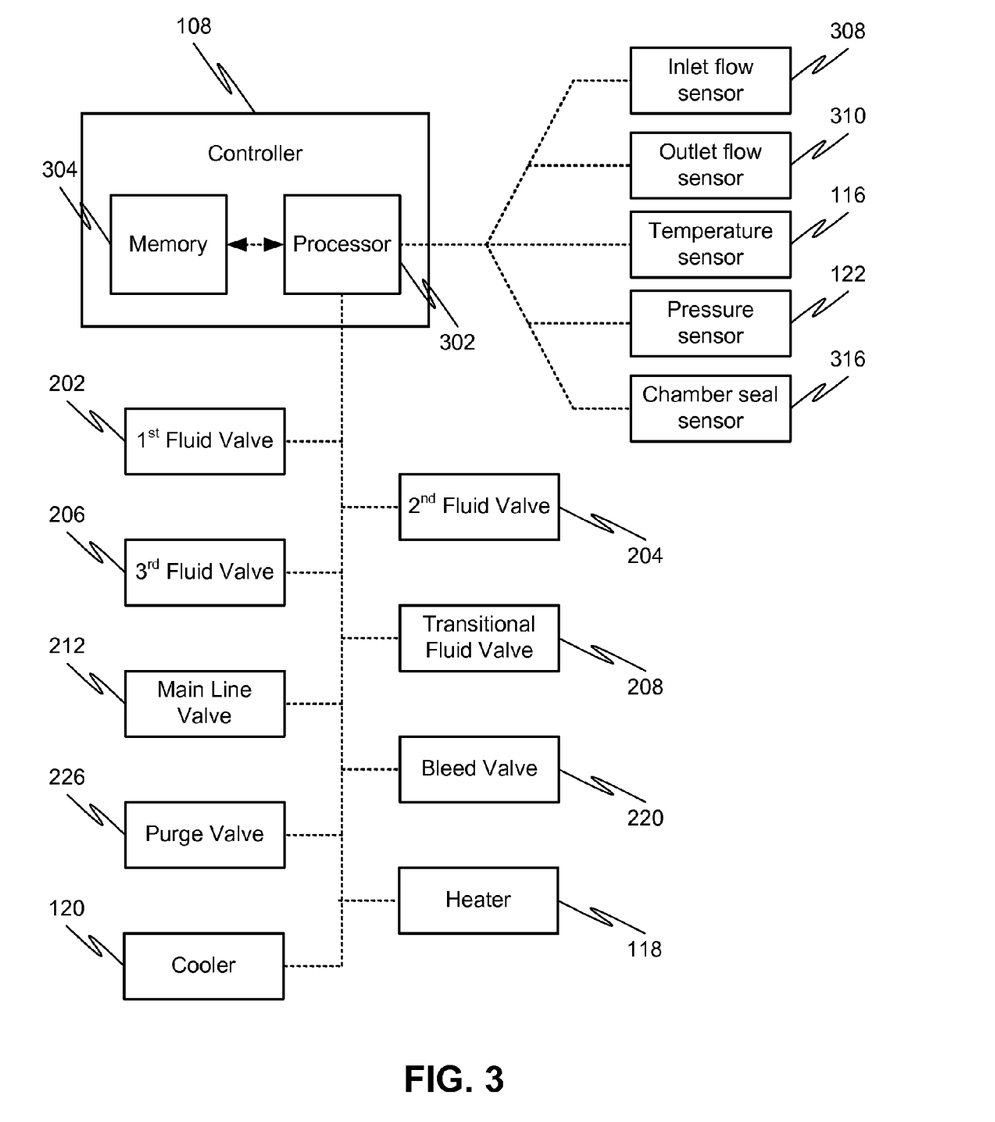
FIG. 3 is a schematic diagram showing the configuration of a controller for use in an integrated processing and drying system, according to one or more embodiments of the disclosed subject matter.

Referring now to FIGS. 2 and 3, controller 108 can include one or more processors 302 operatively coupled with one or more memories 304. The memory 304 or other computer-readable medium can include instructions thereon capable of executing the various steps or stages of the integrated processing and drying methods described herein. The processor 302 may be operatively connected to the various controllable valves in the inlet fluid control module and outlet fluid control module to control fluid flow through the system 100. The processor 302 can also be connected to one or more sensors for monitoring the condition of the system 100. For example, temperature sensor 116 and pressure sensor 122 can send information regarding the temperature and pressure, respectively, to the controller 108 for use in controlling heater 118 or cooler 120.

Controller 108 may also send control signals to one or more valves to cause the valves to fully open, partially open, or close. For example, controller 108 may control first fluid (e.g., release agent) valve 202, second fluid (e.g., flushing fluid) valve 204, third fluid (e.g., dehydrating agent) valve 206, transitional fluid valve 208, main line valve 212, bleed valve 220, and/or purge valve 226. One or more flow sensors, such as inlet flow sensor 308 and outlet flow sensor 310, may communicate the status of fluid flow within the system 100 to controller 108 to control operation of the valves responsively thereto. A chamber seal sensor 316 may also be provided so that the controller 108 does not proceed with the processing and drying steps unless the chamber seal sensor 316 indicates that the pressure chamber 102 has been appropriately closed and sealed.

Figure 4:
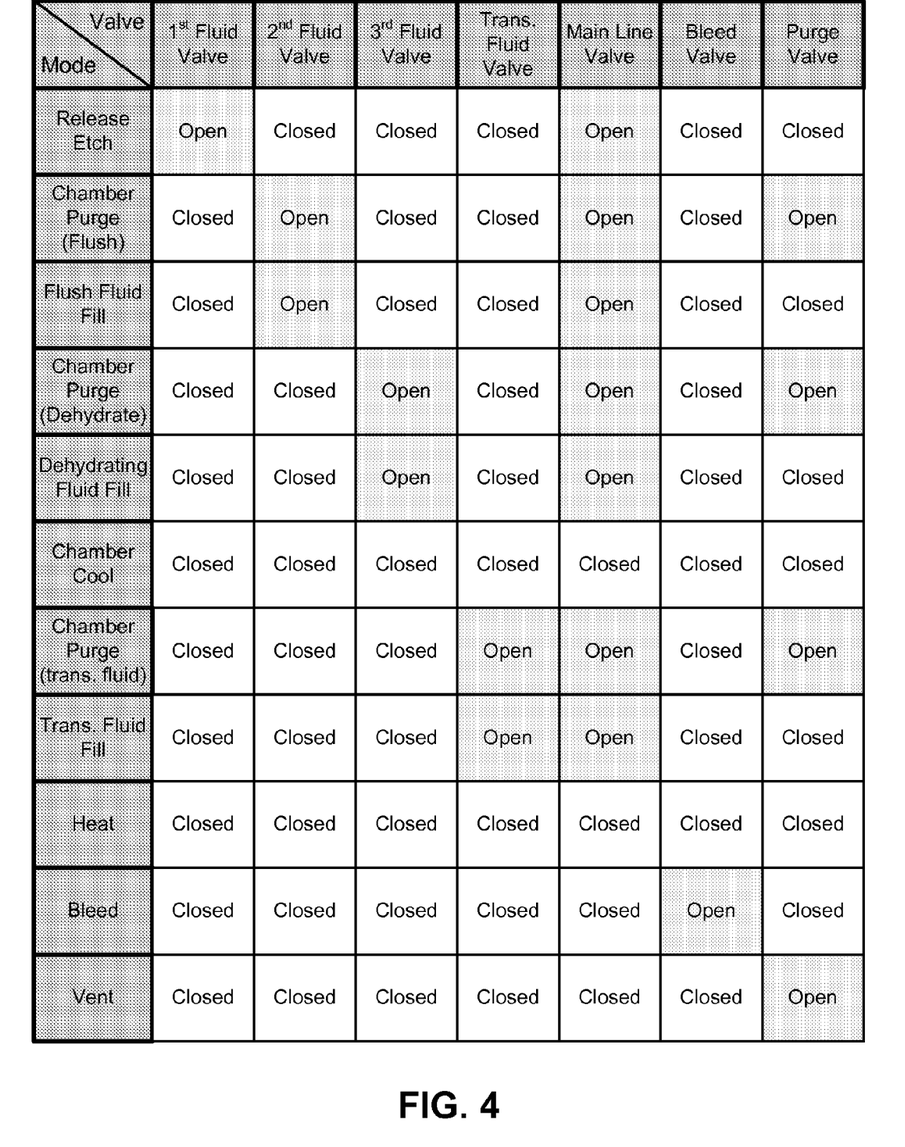
FIG. 4 is a chart showing the configuration of the various valves in an integrated processing and drying system during various modes of operation, according to one or more embodiments of the disclosed subject matter.
Figure 5A:
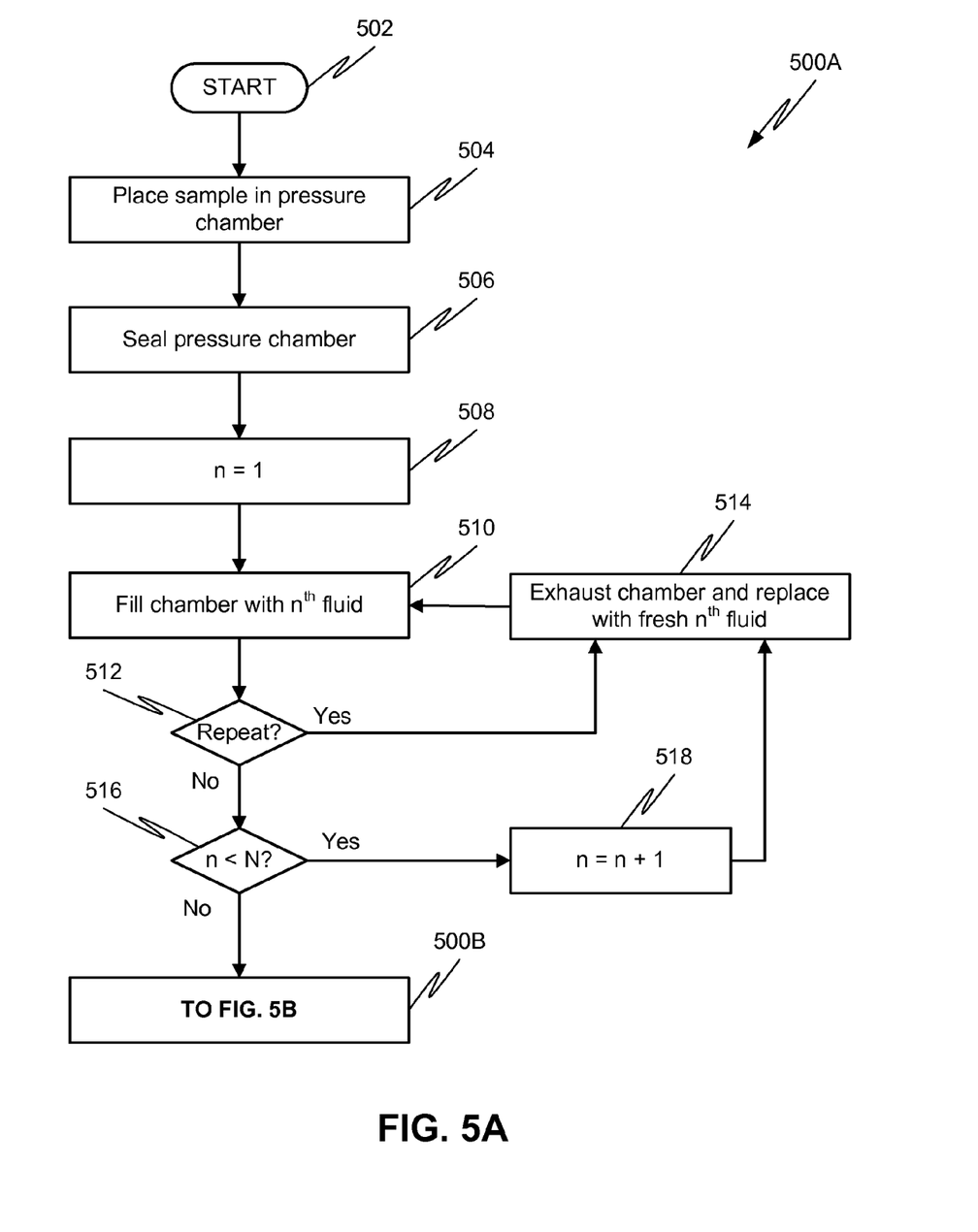
FIGS. 5A-5B is a process flow diagram of a processing and drying method, according to one or more embodiments of the disclosed subject matter.
Figure 5B:
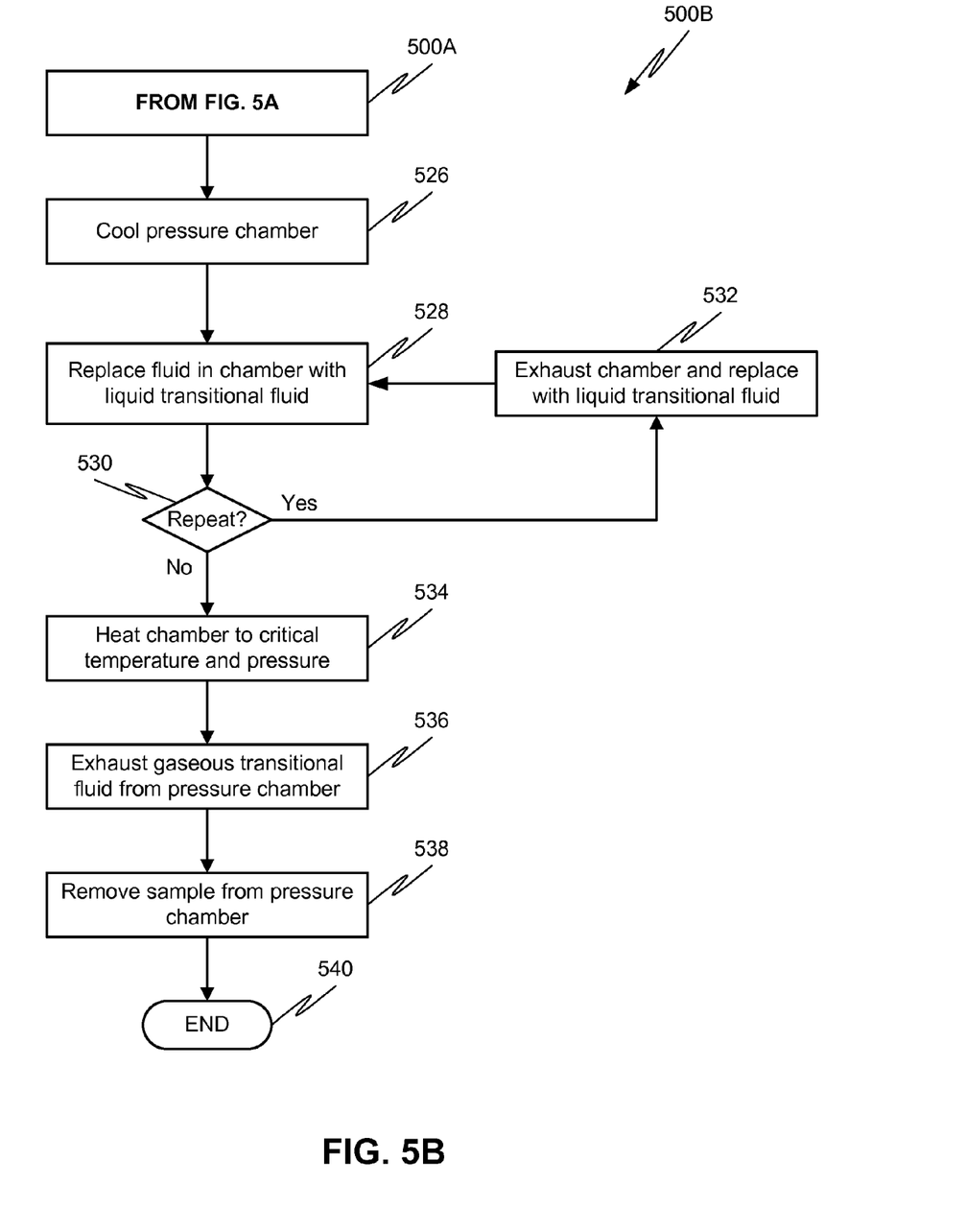

Referring now to FIGS. 4-5, a process that can be executed by an integrated system 100A/100B in processing a sample, for example a MEMS device, is described. FIG. 4 is a chart showing the various valve states during different stages in a release and drying method for a MEMS device, while FIG. 5 is a flow chart showing steps in a generalized processing and drying method.

The method begins at 502 with processing stage 500A, shown in FIG. 5A, before proceeding to a drying stage 500B, shown in FIG. 5B. The method proceeds to step 504 where the sample, such as an unreleased MEMS device, is placed in pressure chamber 102. At this point, all valves in the system are closed, as no fluid flow is necessary. In step 506, the pressure chamber 108 is manually or automatically sealed with the sample contained therein. The method proceeds to step 508 where a counter variable, n, corresponding to the particular fluid for introduction into the pressure chamber is set to 1. For example, the first fluid to be introduced into the chamber can be a sacrificial layer etchant. The method then proceeds to step 510.

In step 510, the controller 108 commands the $n^{th}$ fluid valve and the main line valve 212 to open while all other valves remain closed such that the pressure chamber 102 is filled with the $n^{th}$ fluid. For example, when the first fluid is a release agent, release agent valve 202 may be opened while all other valves remain closed so as to fill the pressure chamber 102 with the release agent. Once the chamber is filled, the valves may be closed. The $n^{th}$ fluid may be maintained in the pressure chamber 102 for a predetermined period of time. For example, when the first fluid is a release agent, the first fluid may be maintained in the pressure chamber for a sufficient period of time to completely etch the sacrificial layers of the MEMS device, thereby resulting in the release of said device. The method may then proceed to step 516.

Alternatively, the $n^{th}$ fluid in the pressure chamber 102 may be replaced with one or more exchanges of fresh $n^{th}$ fluid. In such an alternative, the method proceeds to step 512 where it is determined if the $n^{th}$ fluid introduction should be repeated with fresh fluid. If so, the method proceeds to step 514. For example, when the first fluid is a release agent and is to be replaced with fresh release agent, the controller 108 can command the release agent valve 202, the main line valve 212, and the purge valve 226 to open while all other valves remain closed. After a sufficient time to allow the volume in the pressure chamber 102 to be exchanged with fresh $n^{th}$ fluid, the method then proceeds back to step 512. After step 512, if no further exchanges are needed, the method proceeds to step 516.

In still another alternative, fresh $n^{th}$ fluid may be continuously flowed through the pressure chamber 102 while removing fluid from the pressure chamber 102 rather than having separate fill, dwell, and exchange steps. After a sufficient time of continuous flow, the method proceeds to step 516.

In step 516, the counter variable, n, is compared with the total number of fluid sources, N, to be introduced into the pressure chamber. If n is less than N, then the method proceeds to step 518. Steps 514, 510, 512, and 516 can then be repeated until all fluids have been sequentially introduced into the pressure chamber (i.e., until n=N).

For example, in a release process, the total number of fluids may be three (i.e., N=3) with the first fluid (n=1) being the release agent. The second fluid (n=2) may be a flushing fluid, such as DIW. Thus, in step 514 for the iteration with n=2, the release agent in the pressure chamber 102 is replaced with flushing fluid. First, the pressure chamber 102 is purged to remove the release agent. Controller 108 commands flushing fluid valve 204, main line valve 212, and purge valve 226 to open while all other valves remain closed such that flushing fluid fills the pressure chamber 102 as the contents of the pressure chamber 102 are removed via the main vent line 234. After a predetermined time (or, alternatively, after a predetermined volume of flushing fluid has flowed through the pressure chamber), the pressure chamber 102 may be filled with flushing fluid by closing purge valve 226. After the fill with flushing fluid in step 510, the method may dwell for a predetermined period of time to allow the flushing fluid to fully penetrate the released MEMS or semiconductor device. The method then proceeds to step 516.

Alternatively, the flushing fluid in the pressure chamber 102 may be replaced with one or more exchanges of fresh flushing fluid. In such an alternative, the process proceeds to step 512 where it is determined if the flushing fluid should be repeated with a fresh bath. For example, the flushing fluid fill may be repeated two additional times for a total of three flushing fluid baths. If so, the process proceeds to step 514. The controller 108 can command the flushing fluid valve 204, the main line valve 212, and the purge valve 226 to open while all other valves remain closed. After a sufficient time to allow the volume in the pressure chamber 102 to be exchanged with fresh flushing fluid, the process then proceeds back to the fill and dwell portions of step 510. After step 510, if no further exchanges are needed, the process proceeds to step 516.

In still another alternative, fresh flushing fluid may be continuously flowed through the pressure chamber 102 while removing fluid from the pressure chamber 102 rather than having separate fill, dwell, and exchange steps. After a sufficient time of continuous flow, the process proceeds to step 516.

The third fluid (n=3) may be a dehydrating fluid, such as ethanol or isopropyl alcohol (IPA). Thus, in step 514 for the iteration with n=3, the flushing fluid in the pressure chamber 102 is replaced with dehydrating fluid. First, the pressure chamber 102 is purged to remove the flushing fluid. Controller 108 commands dehydrating fluid valve 206, main line valve 212, and purge valve 226 to open while all other valves remain closed such that dehydrating fluid fills the pressure chamber 102 as the contents of the pressure chamber 102 are removed via the main vent line 234. After a predetermined time (or, alternatively, after a predetermined volume of dehydrating fluid has flowed through the pressure chamber), the pressure chamber 102 may be filled with dehydrating fluid by closing purge valve 226. After the fill with dehydrating fluid, the method may dwell for a predetermined period of time to allow the dehydrating fluid to fully penetrate the released MEMS or semiconductor device. The method can then proceed to step 516.

Alternatively, the dehydrating fluid in the pressure chamber 102 may be replaced with one or more exchanges of fresh dehydrating fluid. In such an alternative, the method proceeds to step 512 where it is determined if the dehydrating fluid should be repeated with a fresh bath. For example, the dehydrating fluid fill may be repeated two additional times for a total of three dehydrating fluid baths. If so, the method proceeds to step 514. The controller 108 can command the dehydrating fluid valve 206, the main line valve 212, and the purge valve 226 to open while all other valves remain closed. After a sufficient time to allow the volume in the pressure chamber 102 to be exchanged with fresh dehydrating fluid, the method then proceeds back to the fill and dwell portions of step 510. After step 510, if no further exchanges are needed, the method can proceed to step 516.

In still another alternative, fresh dehydrating fluid may be continuously flowed through the pressure chamber 102 while removing fluid from the pressure chamber 102 rather than having separate fill, dwell, and exchange steps. After a sufficient time of continuous flow, the method can proceed to step 516.

Once all of the desired processing fluids have been introduced into the pressure chamber, the method proceeds from step 516 to the first step of the drying process 500B. Referring to FIG. 5B, the method continues with the first step 526 in the drying stage 500B. In step 526, the chamber is cooled to a temperature sufficient for introduction of the transitional fluid into the pressure chamber 102 in a liquid phase. For example, when the transitional fluid is carbon dioxide, the pressure chamber 102 may be cooled to a temperature less than or equal to 10° C. The controller 108 may control cooler 120 to achieve the desired cooling. At this point, all valves in the system may be closed since fluid flow may not be necessary. After achieving the temperature, the method proceeds to step 528; however, the controller 108 may command the cooler 120 to provide additional cooling during steps 528-532 so as to maintain the temperature of the pressure chamber below the desired liquid phase temperature.

In step 528, the fluid in the pressure chamber 102 is replaced with liquid transitional fluid. For example, the transitional fluid may be carbon dioxide. First, the pressure chamber 102 is purged to remove the fluid therein (e.g., dehydrating fluid). Controller 108 commands transitional fluid valve 208, main line valve 212, and purge valve 226 to open while all other valves remain closed such that transitional fluid fills the pressure chamber 102 as the contents of the pressure chamber 102 are removed via the main vent line 234. After a predetermined time (or, alternatively, after a predetermined volume of transitional fluid has flowed through the pressure chamber), the pressure chamber 102 may be filled with transitional fluid by closing purge valve 226. After the fill with transitional fluid, the process may dwell for a predetermined period of time to allow the liquid transitional fluid to fully penetrate the sample. The method then proceeds to step 534.

Alternatively, the transitional fluid in the pressure chamber 102 may be replaced with one or more exchanges of fresh transitional fluid. In such an alternative, the method proceeds to step 530 where it is determined if the transitional fluid should be repeated with fresh fluid. For example, the transitional fluid fill may be repeated two additional times for a total of three transitional fluid baths. If so, the process proceeds to step 532. The controller 108 can command the transitional fluid valve 208, the main line valve 212, and the purge valve 226 to open while all other valves remain closed. After a sufficient time to allow the volume in the pressure chamber 102 to be exchanged with fresh transitional fluid, the method then proceeds back to the fill and dwell portions of step 528. After step 528, if no further exchanges are needed, the method proceeds to step 534.

In still another alternative, fresh transitional fluid may be continuously flowed through the pressure chamber 102 while removing fluid from the pressure chamber 102 rather than having separate fill, dwell, and exchange steps. After a sufficient time of continuous flow, the method proceeds to step 534.

In step 534, the pressure chamber 102 is heated to achieve a temperature and pressure exceeding the critical point of the transitional fluid, such that the transitional fluid is contained in the pressure chamber in a supercritical fluid state. For example, when carbon dioxide is used as the transitional fluid, the pressure chamber is heated to a temperature and pressure in excess of the critical point of 31° C. and 1072 psi. The controller 108 may control heater 118 to achieve the desired heating. At this point, all valves in the system may be closed since fluid flow may not be necessary. After achieving the temperature, the method proceeds to step 536; however, the controller 108 may command the heater 118 to provide additional heating during step 536 so as to maintain the temperature of the pressure chamber above the desired critical point temperature. The method then proceeds to step 536.

In step 536, the transitional fluid is exhausted from the pressure chamber 102. First, the pressure in the chamber is slowly reduced by "bleeding" the transitional fluid from the pressure chamber 102 via the secondary bleed line. The controller 108 may command all of the valves in the system to close except for bleed valve 220. Bleed valve 220 may be calibrated to maintain a specified low flow rate such that the pressure in the chamber decreases at a predetermined rate. For example, the bleed valve may be calibrated such that the flow rate of transitional fluid through the secondary bleed line results in a rate of pressure drop in the pressure chamber 102 between 100 psi/minute and 150 psi/minute. Alternatively, controller 108 can monitor the flow rate through the secondary bleed line via outlet flow sensor 310 and/or the pressure in the chamber via sensor 122 and adjust bleed valve 220 to achieve the desired rate of pressure drop.

Once the pressure in the chamber 102 reaches a sufficiently low pressure, the controller 108 may then vent the chamber 102. For example, the chamber 108 may begin venting the chamber 102 once the pressure in the chamber is less than or equal to 400 psi. The controller may command all of the valves in the system to close except for purge valve 226 such that transitional fluid in the pressure chamber 102 is exhausted through main vent line 234. Purge valve 226 may allow for much faster exhaust than the bleed valve 220 would allow. Once the pressure in the chamber is equal to atmospheric pressure, the method can then proceed to step 538. In step 538, the sample has finished undergoing the various processing and drying steps. The pressure chamber 102 can be unsealed, and the sample can be removed for subsequent processing and/or use. The method thus terminates at 540.

Although automated control using controller 108 is described above, the teachings of the present disclosure are equally applicable to manual or semi-automated systems as well. In particular, controller 108 may be replaced by manual input from a user, such as by manually actuating valves of inlet fluid control module 110 and outlet fluid control module 112. Moreover, controller 108 can execute the various processing and drying steps on a semi-automated basis, such as in response to commands or input from the user through a user interface. In addition, controller 108 can be configured to operate in a normally automatic mode to execute the processing and drying steps without user input and to operate on a semi-automatic basis based on user input through a user interface. Furthermore, the controller 108 can be configured to allow customization of the processing and/or drying steps by a user. For example, a user can program the controller 108 to adjust the amount of time of a particular processing or drying step, the flow configurations of a particular processing or drying step, the order of processing or drying steps, or even which steps should or should not be performed.

The controller 108 can also be configured to perform one or more of the processing or drying steps without performing others of the processing or drying steps. For example, if stiction is not an issue with a particular device design, a user may program the controller 108 to execute just a sacrificial layer etch and DIW flush. In another example, if the device has already been released and dehydrated, the controller 108 may be programmed to perform only the drying steps.

In other configurations, one or more functions of the controller may be replaced with manual or mechanical control. For example, an operator may control operation of the valves and/or thermal management module in response to time or temperature cues. Accordingly, the controller may be partially or completely omitted. In other configurations, mechanical or electrical timers may be used in lieu of a computer or processor to control operation of system 100A/100B, valves of the fluid control modules 110 and 112, and thermal management module 114. Moreover, the controller 108 can be integrated with other controller components, for example, in a MEMS or semiconductor device manufacturing assembly process. Thus, one or more controllers or a central controller for the MEMS or semiconductor device assembly line may control operation of the integrated release and drying system 100.

The use of Monel alloy, or other chemically and pressure resistant materials, for the pressure chamber and fluid conduits allows a single system to be used for both processing and drying steps without having to move the sample between different processing machines or apparatuses. However, Monel alloy may be relatively difficult to machine as compared to other metals, such as steel, and can lead to significant increases in manufacturing and materials costs. As such, it may be advantageous to minimize the use of Monel alloy, especially for those portions that may not see caustic chemicals during normal operation. Accordingly, the pressure chamber may be configured such that at least the interior surfaces thereof and the fluid passages therethrough are formed of a Monel alloy or similar chemically-resistant material.

Figure 6:
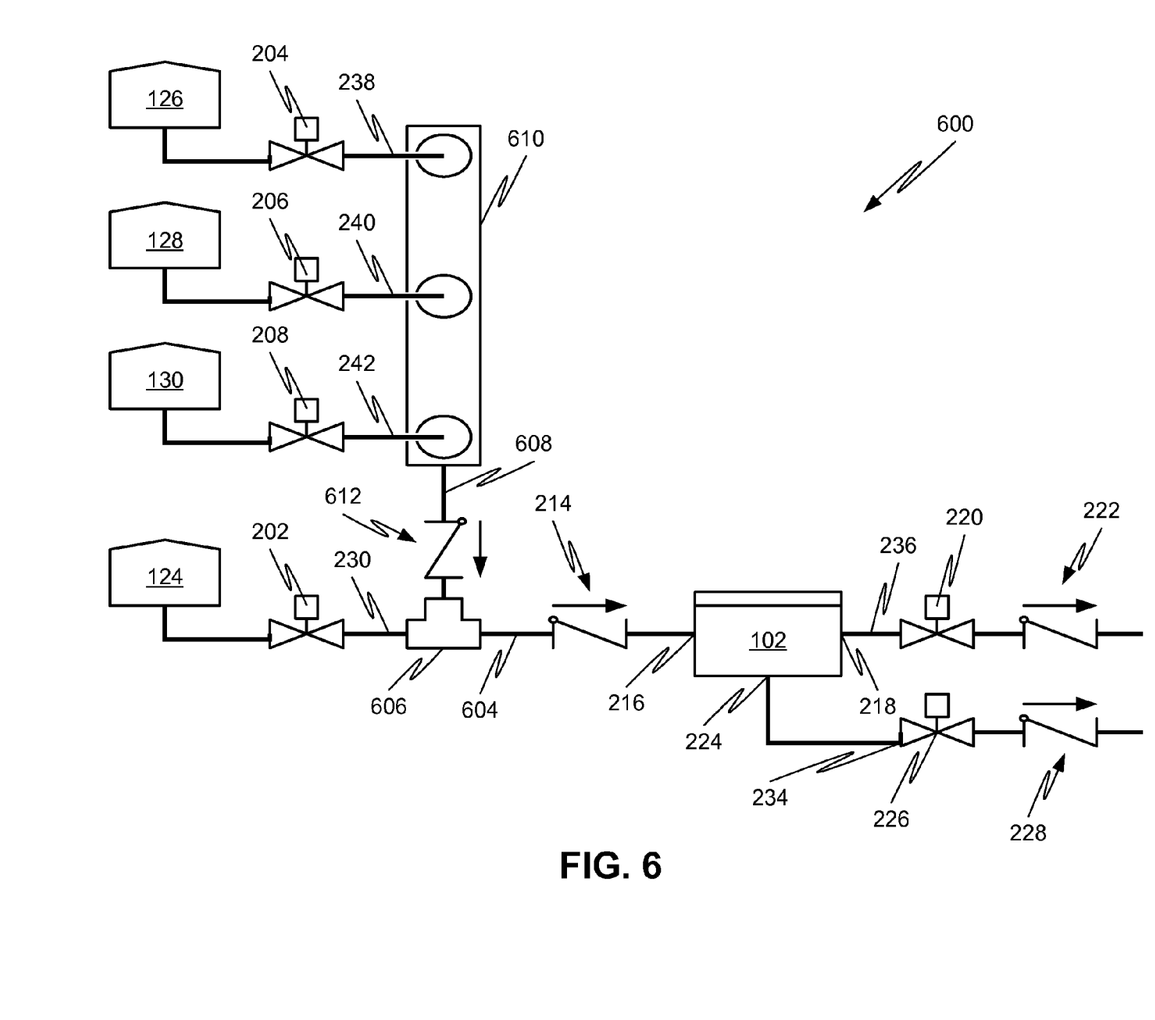
FIG. 6 is a schematic diagram showing an alternative configuration of fluid control components in an integrated processing and drying system, according to one or more embodiments of the disclosed subject matter.

Referring now to FIG. 6, an alternative configuration for inlet and outlet fluid control modules of an integrated system 600 for release and drying is shown. System 600 is substantially similar to the configuration of system 100 illustrated in FIG. 2 with the exception of the configuration of the inlet fluid control module. In particular, fluid input column 610 connects each of the fluid sources 126-130 to a secondary inlet line 608 via the individual input lines. A check valve 612 in secondary inlet line 608 can prevent backflow from primary inlet line 604 into the fluid column 610. Release agent supply 124 is separately connected to a primary inlet line 604 through first input line 230. A T-connector 606 joins the first input line 230 to the primary inlet line 604, and the secondary inlet line 608. Because any contact with the caustic agent in the inlet fluid control module is isolated to the first input line 230, the primary inlet line 604, and the lower portion of the secondary inlet line 608, the use of Monel alloy or other chemically resistant material can be confined to these areas, thereby minimizing the use of these materials. Of course, the pressure chamber 102 and components of the outlet fluid control module will still need to be constructed from a Monel alloy or other chemically resistant material as their contact with the caustic agent has not been altered.

Figure 7:
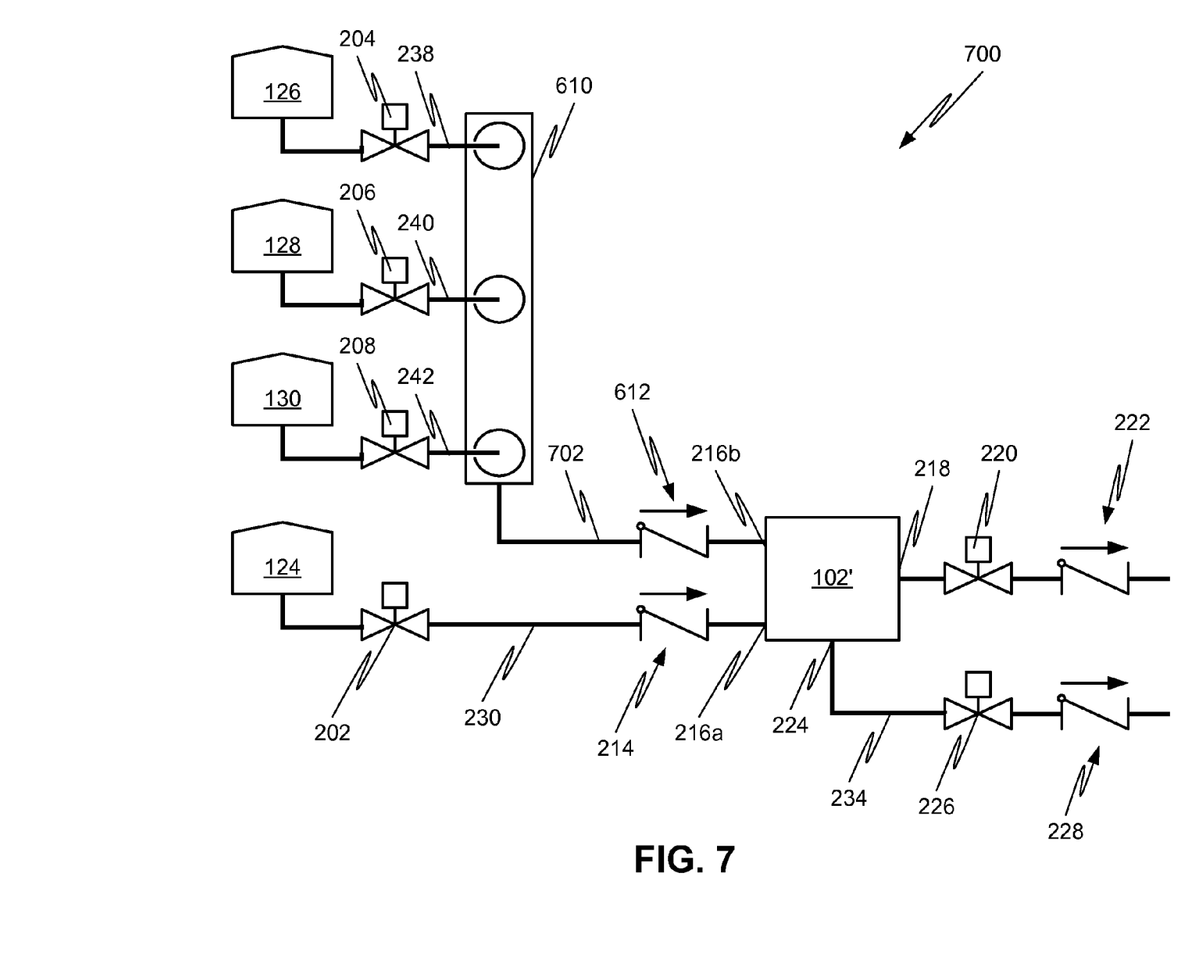
FIG. 7 is a schematic diagram showing another configuration of fluid control components in an integrated processing and drying system, according to one or more embodiments of the disclosed subject matter.

Referring now to FIG. 7, yet another alternative configuration for inlet and outlet fluid control modules of an integrated system 700 for release and drying is shown. System 700 is substantially similar to the configuration of system 600 illustrated in FIG. 6 with the exception of the configuration of the pressure chamber and the inlet fluid control module with respect to the non-caustic fluid sources. In particular, fluid input column 610 connects each of the fluid sources 126-130 to a secondary inlet line 702 via the individual input lines. The secondary inlet line 702 is directly connected to a secondary inlet 216b of pressure chamber 102'. Release agent supply 124 is separately connected to the primary inlet 216b of the pressure chamber 102' via first input line 230. Because any contact with the caustic agent in the inlet fluid control module is isolated to the first input line 230, the use of Monel alloy or other chemically resistant material can be confined to the first input line 230, thereby minimizing the use of these materials. Of course, the pressure chamber 102' and components of the outlet fluid control module will still need to be constructed from a Monel alloy or other chemically resistant material as their contact with the caustic agent has not been altered.

As discussed above, various passive mechanisms (e.g., gravity, tank pressure) may be employed to provide fluid flow out of the respective fluid sources into the inlet fluid control module and pressure chamber. Active fluid conveyance mechanisms may also be used. For example, one or more pumps may be employed in the inlet fluid control module and/or the outlet fluid control module. Alternatively, one or more pumps may be employed in the fluid supply 106 itself. Other types of fluid conveyance mechanisms may also be employed.

Figure 8:
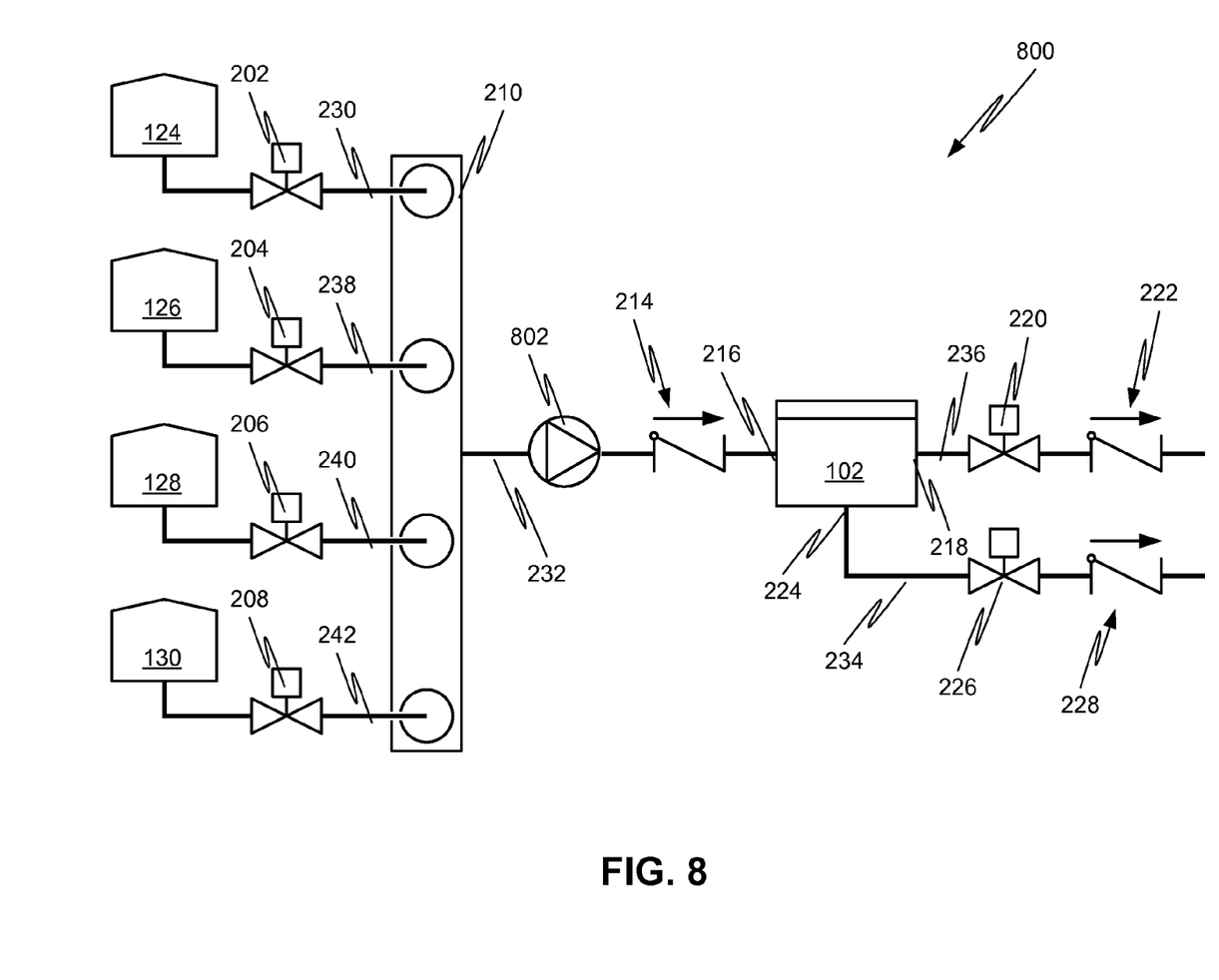
FIG. 8 is a schematic diagram showing yet another configuration of fluid control components in an integrated processing and drying system, according to one or more embodiments of the disclosed subject matter.

Referring now to FIG. 8, a configuration for inlet and outlet fluid control modules of an integrated system 800 employing a pump is shown. System 800 is substantially similar to the configuration of system 100 illustrated in FIG. 2 but with the addition of a pump 802 in the inlet fluid control module. In particular, pump 802 has replaced valve 212 in inlet line 232. As the pump may be exposed to the caustic chemicals employed in the release process, at least the surfaces of the pump in contact with the chemicals can be constructed of a chemically resistant material. Alternatively, the pump can be constructed so as to avoid contact with the fluid. For example, the pump may be a peristaltic pump if the tubing in inlet line 232 is sufficiently flexible to allow compression by the rollers of the peristaltic pump without permanent deformation. Of course, one or more pumps may be provided elsewhere within the integrated release and drying system as needed.

The embodiments of FIGS. 2 and 6-8 have been discussed with respect to the configuration of FIG. 1A; however, the embodiments of FIGS. 2, and 6-8 are equally applicable to the configuration of FIG. 1B with appropriate modifications to accommodate the additional fluid supplies.

The integrated processing and drying systems described herein may be integrated into a MEMS or semiconductor device assembly line so as to form a portion of an overall manufacturing system. Alternatively, the integrated processing and drying systems may be embodied as a separate unit, either at a same location as the overall MEMS or semiconductor device assembly line or remote therefrom. For example, the integrated processing and drying system 100 may be disposed at the location of an intermediate manufacturer or an end user of the MEMS or semiconductor device. The MEMS or semiconductor devices may be shipped from the primary manufacturer to the intermediate manufacturer or end user without releasing so as to prevent damage to the individual structures thereon.

While specific configurations have been illustrated in the accompanying figures and discussed in detail herein, configurations and embodiments according to the present disclosure are not limited thereto. Moreover, although specific chemicals have been discussed, other chemicals may be used as well. For example, other etchants besides 49% HF may be used. Such etchants may include, but are not limited to, buffered oxide etchant (BOE), potassium hydroxide (KOH), or gold etchant. In still another example, other transitional fluids, such as, but not limited to, hydrogen, oxygen, nitrogen, and carbon monoxide, can be used according to contemplated embodiments of the disclosed subject matter. In addition, the systems, methods, and devices described herein can be applied to non-semiconductor and non-MEMS devices as well. For example, the techniques described herein may be applied to the processing and drying of gels or biological material.

Moreover, the recitation of fluid herein is not intended to be limited to substances in a liquid state. Rather, substances in a gaseous or supercritical fluid state are also encompassed by the use of the term fluid. Thus, fluids introduced into the pressure chamber need not be a liquid to be considered a fluid. For example, the fluid may be a gaseous etchant, such as xenon difluoride ($XeF_2$) for etching of silicon. All chemicals and compositions described herein are for illustration purposes only and should not be understood as limiting of the embodiments of the disclosed subject matter. Furthermore, the foregoing descriptions apply, in some cases, to examples generated in a laboratory, but these examples can be extended to production techniques. Where quantities and techniques apply to the laboratory examples, they should not be understood as limiting.

It is, thus, apparent that there is provided, in accordance with the present disclosure, integrated processing and drying systems, methods, and devices for semiconductor and/or MEMS devices. Many alternatives, modifications, and variations are enabled by the present disclosure. Features of the disclosed embodiments can be combined, rearranged, omitted, etc., within the scope of the invention to produce additional embodiments. Furthermore, certain features may sometimes be used to advantage without a corresponding use of other features. Accordingly, Applicant intends to embrace all such alternatives, modifications, equivalents, and variations that are within the spirit and scope of the present invention.

The invention claimed is:

1. An apparatus for processing a sample, the apparatus comprising:
a pressure chamber having an interior volume constructed to receive the sample therein, surfaces of the pressure chamber that define said interior volume being formed of a nickel-copper alloy, the pressure chamber having at least one inlet and at least one outlet that are in fluid communication with the interior volume;
a heater thermally coupled to the pressure chamber to heat the interior volume;
a cooler thermally coupled to the pressure chamber to cool the interior volume;
a fluid supply module connected to the at least one inlet by a fluid conduit, the fluid conduit also being formed of a nickel-copper alloy, the fluid supply module being configured to sequentially deliver fluids to the interior volume by way of the at least one inlet; and
a controller operatively coupled to the heater, the cooler, and the fluid supply module, the controller being configured to:
after sealing of the pressure chamber with the sample therein, control the fluid supply module to deliver a first fluid to the interior volume;
at a time after the delivery of the first fluid, control the cooler to cool the interior volume to a temperature less than 10° C.;
once the temperature is less than 10° C., control the fluid supply module to deliver a second fluid to the interior volume; and
at a time after the delivery of the second fluid, control the heater to heat the interior volume to a temperature greater than 31° C. and a pressure greater than 1072 psi.

2. The apparatus of claim 1, wherein the first fluid is hydrofluoric acid and the second fluid is carbon dioxide.

3. The apparatus of claim 1, further comprising:
a temperature sensor which monitors the temperature of the interior volume; and
a pressure sensor which monitors the pressure of the interior volume,
wherein the controller is configured to receive temperature and pressure signals from said sensors and to control responsively thereto.

4. The apparatus of claim 1, wherein the nickel-copper alloy has about 60% nickel and about 30% copper.

5. The apparatus of claim 1, further comprising:
respective sources of first through fourth fluids, each of said sources being connected to the fluid supply module,
wherein the first fluid is hydrofluoric acid, the second fluid is carbon dioxide, the third fluid is water, and the fourth fluid is alcohol.

6. The apparatus of claim 1, wherein the fluid supply module further comprises a valve located upstream of the at least one inlet for controlling fluid flow thereto, wherein at least a portion of the valve is formed of a nickel-copper alloy.

* * * * *